United States Patent
Xu et al.

(10) Patent No.: US 10,943,927 B2
(45) Date of Patent: Mar. 9, 2021

(54) ARRAY SUBSTRATE, FABRICATION METHOD THEREOF, DRIVING TRANSISTOR AND DISPLAY PANEL

(71) Applicants: Beijing BOE Display Technology Co., Ltd., Beijing (CN); BOE TECHNOLOGY GROUP CO., LTD., Beijing (CN)

(72) Inventors: Wenqing Xu, Beijing (CN); Mingxuan Liu, Beijing (CN); Jing Wang, Beijing (CN); Xiaoxiang Zhang, Beijing (CN); Huibin Guo, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/809,794

(22) Filed: Mar. 5, 2020

(65) Prior Publication Data

US 2020/0203389 A1  Jun. 25, 2020

Related U.S. Application Data

(62) Division of application No. 15/769,492, filed as application No. PCT/CN2017/109284 on Nov. 3, 2017, now Pat. No. 10,644,035.

(30) Foreign Application Priority Data

Mar. 10, 2017 (CN) .......................... 201710142461.6

(51) Int. Cl.
*H01L 27/14* (2006.01)
*H01L 27/12* (2006.01)
(Continued)

(52) U.S. Cl.
CPC ....... *H01L 27/1229* (2013.01); *G09G 3/3225* (2013.01); *H01L 27/124* (2013.01);
(Continued)

(58) Field of Classification Search
CPC ............... H01L 27/124; H01L 27/1285; H01L 27/3276; H01L 27/1229
(Continued)

(56) References Cited

U.S. PATENT DOCUMENTS 8,158,985 B2 * 4/2012 Liu ..................... H01L 27/1248
257/72
9,356,260 B2 * 5/2016 Hsu ......................... H01L 51/56
(Continued)

FOREIGN PATENT DOCUMENTS

CN  1501336 A  6/2004
CN  1536542 A  10/2004
(Continued)

OTHER PUBLICATIONS

First Office Action in the Chinese Patent Application No. 201710142461.6, dated Mar. 16, 2020; English translation attached.
(Continued)

*Primary Examiner* — Tan N Tran
(74) *Attorney, Agent, or Firm* — Intellectual Valley Law, P.C.

(57) ABSTRACT

An array substrate includes a pixel circuit and a light-emitting diode. The pixel circuit includes a driving transistor including a first active medium made of polysilicon, and a switching transistor including a second active medium made of polysilicon. The first active medium has a first grain size. The second active medium has a second grain size larger than the first grain size. The light-emitting diode is coupled to the pixel circuit.

6 Claims, 9 Drawing Sheets

(51) Int. Cl.
*H01L 29/786* (2006.01)
*H01L 29/66* (2006.01)
*G09G 3/3225* (2016.01)
*H01L 27/32* (2006.01)

(52) U.S. Cl.
CPC ...... *H01L 27/1237* (2013.01); *H01L 27/1285* (2013.01); *H01L 27/3276* (2013.01); *H01L 29/66757* (2013.01); *H01L 29/78675* (2013.01); *G09G 2300/0426* (2013.01); *G09G 2300/0439* (2013.01)

(58) Field of Classification Search
USPC .............................................. 257/40, 59, 72
See application file for complete search history.

(56) References Cited

U.S. PATENT DOCUMENTS

| | | |
|---|---|---|
| 2004/0169182 A1 | 9/2004 | Koo et al. |
| 2004/0195570 A1 | 10/2004 | Koo et al. |
| 2005/0062047 A1 | 3/2005 | Kazuhiro et al. |
| 2005/0225253 A1 | 10/2005 | Yamada et al. |
| 2008/0087889 A1 | 4/2008 | Chan et al. |
| 2009/0072225 A1 | 3/2009 | Koo et al. |
| 2009/0194770 A1 | 8/2009 | Liu et al. |
| 2010/0181574 A1 | 7/2010 | Liu et al. |
| 2015/0014638 A1 | 1/2015 | Kwon et al. |
| 2015/0069335 A1 | 3/2015 | Hsu |

FOREIGN PATENT DOCUMENTS

| | | |
|---|---|---|
| CN | 1681361 A | 10/2005 |
| CN | 101170076 A | 4/2008 |
| CN | 101404142 A | 4/2009 |
| CN | 101593730 A | 12/2009 |
| CN | 103456765 A | 12/2013 |
| CN | 104282259 A | 1/2015 |
| TW | 201029174 A | 8/2010 |

OTHER PUBLICATIONS

International Search Report & Written Opinion dated Feb. 2, 2018, regarding PCT/CN2017/109284.
Restriction Requirement in the U.S. Appl. No. 15/769,492, dated Apr. 25, 2019.
Response to Restriction Requirement in the U.S. Appl. No. 15/769,492, dated Jun. 21, 2019.
Non-Final Office Action in the U.S. Appl. No. 15/769,492, dated Sep. 5, 2019.
Response to Non-Final Office Action in the U.S. Appl. No. 15/769,492, dated Nov. 22, 2019.
Notice of Allowance in the U.S. Appl. No. 15/769,492, dated Dec. 12, 2019.
First Office Action in the Indian Patent Application No. 201747018523, dated Aug. 3, 2020.
Second Office Action in the Chinese Patent Application No. 201710142461.6, dated Aug. 17, 2020; English translation attached.
The Extended European Search Report in the European Patent Application No. 17861198.4, dated Nov. 16, 2020.
Third Office Action in the Chinese Patent Application No. 201710142461.6, dated Nov. 23, 2020; English translation attached.

* cited by examiner

Larger Grain Size          Smaller Grain Size

ARRAY SUBSTRATE, FABRICATION METHOD THEREOF, DRIVING TRANSISTOR AND DISPLAY PANEL

CROSS-REFERENCE TO RELATED APPLICATION

This application is a divisional of U.S. application Ser. No. 15/769,492, filed Nov. 3, 2017, which is a national stage application under 35 U.S.C. § 371 of International Application No. PCT/CN2017/109284, filed Nov. 3, 2017, which claims priority to Chinese Patent Application No. 201710142461.6, filed on Mar. 10, 2017. Each of the forgoing applications is herein incorporated by reference in its entirety for all purposes.

TECHNICAL FIELD

The present disclosure generally relates to the field of display technologies and, more particularly, to an array substrate, a fabrication method thereof, a driving transistor, and a display panel.

BACKGROUND

An organic light-emitting diode (OLED) display panel includes an array substrate. An array substrate includes a substrate, and a plurality of pixel regions disposed over the substrate and arranged in an array. Each pixel region includes an OLED, and a pixel circuit for controlling the OLED such that the OLED emits light.

In a pixel region, the pixel circuit may include a switching transistor and a driving transistor coupled to a control integrated circuit (IC). To turn on the OLED in the pixel region to emit light, the control IC can input turn-on voltages to the switching transistor and the driving transistor, thereby turning on the switching transistor and the driving transistor. Further, the control IC can input a driving voltage to a source electrode of the driving transistor, and the driving transistor can input a driving current to the OLED according to the driving voltage. As a result, the OLED emits light under an influence of the driving current. The driving current of a driving transistor is related to the threshold voltage of the driving transistor. Thus, when two driving transistors have different threshold voltages, the two driving transistors may provide different driving currents under the same driving voltage.

SUMMARY

In one aspect, the present disclosure provides an array substrate. The array substrate includes a pixel circuit and a light-emitting diode coupled to the pixel circuit. The pixel circuit includes a driving transistor and a switching transistor. The driving transistor includes a first active medium made of polysilicon. The first active medium has a first grain size. The switching transistor includes a second active medium made of polysilicon. The second active medium has a second grain size larger than the first grain size.

In some embodiments, the driving transistor further includes a first gate electrode, a first source electrode and a first drain electrode, and a first gate insulating block. The switching transistor further includes a second gate electrode, a second source electrode and a second drain electrode, and a second gate insulating block. A thickness of the first gate insulating block is larger than a thickness of the second gate insulating block.

In some embodiments, the array substrate further includes a substrate and a buffer layer over the substrate. The pixel circuit is over the buffer layer.

In some embodiments, the light-emitting diode includes an organic light-emitting diode.

Another aspect of the present disclosure provides a method for fabricating an array substrate. The method includes fabricating a pixel circuit and fabricating an organic light-emitting diode coupled to the pixel circuit. The pixel circuit includes a driving transistor and a switching transistor. The driving transistor includes a first active medium made of polysilicon. The first active medium has a first grain size. The switching transistor includes a second active medium made of polysilicon. The second active medium has a second grain size larger than the first grain size.

In some embodiments, fabricating the pixel circuit includes forming an amorphous silicon layer over a substrate; forming a gate insulating layer over the amorphous silicon layer; forming a preset pattern over the gate insulating layer, where an orthogonal projection of the preset pattern on the substrate overlaps an orthogonal projection of the first active medium on the substrate and does not overlap with an orthogonal projection of the second active medium on the substrate; performing laser annealing to turn the amorphous silicon layer into a polysilicon layer; removing the preset pattern; and forming the driving transistor and the switching transistor based on the polysilicon layer and the gate insulating layer.

In some embodiments, forming the driving transistor and the switching transistor includes patterning the polysilicon layer and the gate insulating layer to form a polysilicon pattern and a gate insulating pattern, where a polysilicon pattern includes the first active medium and the second active medium, and a gate insulating pattern includes a first gate insulating block stacked over the first active medium and a second gate insulating block stacked over the second active medium; forming a gate electrode pattern over the gate insulating pattern, where the gate electrode pattern includes a first gate electrode stacked over the first gate insulating block and a second gate electrode stacked over the second gate insulating block; forming an interlayer insulating layer over the gate electrode pattern; and forming a source/drain electrode pattern over the interlayer insulating layer. The source/drain electrode pattern includes a first source electrode and a first drain electrode coupled to the first active medium, and a second source electrode and a second drain electrode coupled to the second active medium. The driving transistor includes the first gate electrode, the first source electrode, the first drain electrode, and the first active medium. The switching transistor includes the second gate electrode, the second source electrode, the second drain electrode, and the second active medium.

In some embodiments, removing the preset pattern includes applying a preset etching solution capable of etching the preset pattern and the gate insulating layer to remove the preset pattern and reduce a thickness of a region of the gate insulating layer not covered by the preset pattern.

In some embodiments, the method further includes, before forming the interlayer insulating layer, doping portions of the polysilicon pattern.

In some embodiments, forming the source/drain electrode pattern includes forming the first source electrode and the first drain electrode to be coupled to doped regions in the first active medium, and forming the second source electrode and the second drain electrode to be coupled to doped regions in the second active medium.

In some embodiments, forming the preset pattern includes forming an amorphous silicon pattern.

In some embodiments, forming the amorphous silicon layer includes forming an amorphous silicon layer having a thickness of approximately 500 angstroms. Forming the amorphous silicon pattern includes forming an amorphous silicon pattern having a thickness in a range from approximately 100 angstroms to approximately 200 angstroms.

In some embodiments, an orthogonal projection region of an un-doped region of the first active medium on the substrate overlaps an orthogonal projection region of the first gate electrode on the substrate. An orthogonal projection region of an un-doped region of the second active medium on the substrate overlaps an orthogonal projection region of the second gate electrode on the substrate.

In some embodiments, the method further includes, before fabricating the pixel circuit, forming a buffer layer over the substrate. Fabricating the pixel circuit includes fabricating the pixel circuit over the buffer layer.

Another aspect of the present disclosure provides a driving transistor. The driving transistor includes a first active medium having a smaller grain size than a second active medium of a switching transistor. The first active medium and the second active medium are polysilicon.

In some embodiments, the driving transistor further includes a first gate insulating block, a first gate electrode, a first source electrode, and a first drain electrode. The first gate insulating block is over the first active medium, and has a greater thickness than a second gate insulating block in the switching transistor. The first gate electrode is over the first gate insulating block. The first source electrode and a first drain electrode are over the first active medium and electrically coupled to the first active medium.

Another aspect of the present disclosure provides a display panel including an array substrate.

BRIEF DESCRIPTION OF THE FIGURES

The following drawings are merely examples for illustrative purposes according to various disclosed embodiments and are not intended to limit the scope of the present disclosure.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present invention.

The aspects, and features of the present disclosure can be understood by those skilled in the art through the exemplary embodiments of the present disclosure further described in detail with reference to the accompanying drawings.

Figure 1A:
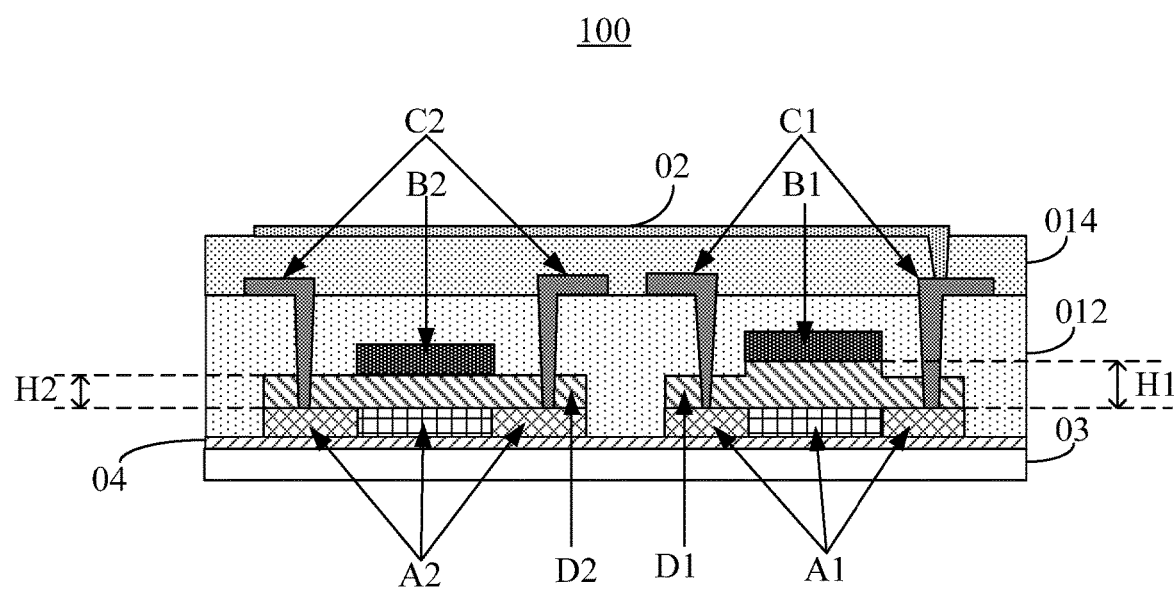
FIG. 1A illustrates a schematic view of an exemplary array substrate according to various disclosed embodiments of the present disclosure.

FIG. 1A illustrates a schematic view of an exemplary array substrate 100 according to various disclosed embodiments of the present disclosure. As shown in FIG. 1A, the array substrate 100 includes a pixel circuit and an organic light-emitting diode (OLED) 02 (one electrode of the OLED 02 is shown in FIG. 1A). The pixel circuit includes a driving transistor and a switching transistor.

The driving transistor includes a first active medium A1, and the switching transistor includes a second active medium A2. Both the first active medium A1 and the second active medium A2 may be polysilicon. The grain size of the first active medium A1 may be smaller than the grain size of the second active medium A2, where the grain size of the first active medium A1 refers to the size of the grains in the first active medium, and the grain size of the second active medium A2 refers to the size of the grains in the second active medium.

In the array substrate consistent with the disclosure, both the first active medium in the driving transistor and the second active medium in the switching transistor may be polysilicon. In addition, the first active medium may have a smaller grain size than the second active medium. That is, if the grain size of the second active medium of the switching transistor is regarded as a standard size, the grain size of the first active medium of the driving transistor is smaller than the standard size. Further, a smaller grain size in the driving transistors can result in a less significant non-uniformity of the threshold voltages in the driving transistors caused by the non-uniform grain sizes. As a result, the driving currents inputted to OLEDs from driving transistors of the OLED display panel may tend to be the same. Accordingly, the brightness of the light emitted from each pixel region may tend to be the same, and the display performance of the OLED display panel can be improved.

In some embodiments, the polysilicon may be low temperature polysilicon.

Figure 1B:
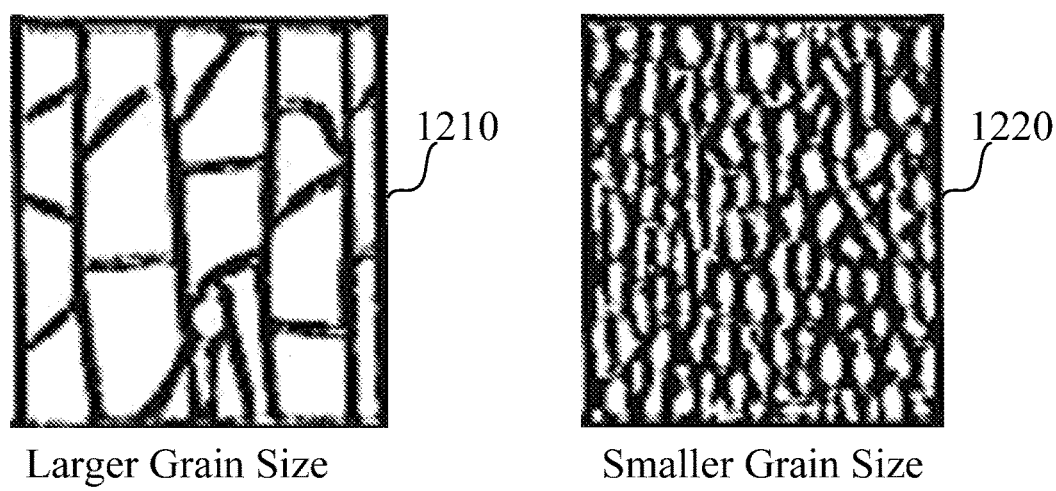
FIG. 1B illustrates schematic views showing two exemplary grain sizes according to various disclosed embodiments of the present disclosure.

FIG. 1B illustrates schematic views showing two exemplary grain sizes according to various disclosed embodiments of the present disclosure. As shown in FIG. 1B, the grain size of polysilicon 1210 is larger and hence less uniform, and the grain size of polysilicon 1220 is smaller and hence more uniform.

In some embodiments, as shown in FIG. 1A, the driving transistor further includes a first gate electrode B1, first source/drain electrodes C1 (i.e. a first source electrode and a first drain electrode), and a first gate insulating block D1. The switching transistor includes a second gate electrode B2, second source/drain electrodes C2 (i.e. a second source electrode and a second drain electrode), and a second gate insulating block D2. In addition, the first gate insulating block D1 has a greater thickness than the second gate insulating block D2. A thicker gate insulating block in a transistor can result in a larger subthreshold swing (SS) coefficient of the transistor. In various application scenarios, in order to effectively control the gray scale, the driving transistor may need to have a greater SS coefficient than the switching transistor. Thus, in some embodiments, the thickness of the first gate insulating block D1 in the driving transistor may be set to be greater than the thickness of the second gate insulating block D2 in the switching transistor. For example, as shown in FIG. 1B, a thickness H1 of the gate insulating block D1 below the first gate electrode B1 is greater than a thickness H2 of the gate insulating block D2 below the second gate electrode B2.

In some embodiments, as shown in FIG. 1A, the array substrate 100 further includes an interlayer insulating layer 012. The first source/drain electrodes C1 are coupled to the first active medium A1 through via holes in the interlayer insulating layer 012. The second source/drain electrodes C2 are coupled to the second active medium A2 through via holes in the interlayer insulating layer 012. A flat layer 014 is formed over the first source/drain electrodes C1 and the second source/drain electrodes C2. The OLED 02 is formed over the flat layer 014. The OLED 02 is coupled to the pixel circuit through a via hole in the flat layer 014.

Further, the array substrate 100 includes a substrate 03 and a buffer layer 04 disposed over the substrate 03. The pixel circuit is disposed over the substrate 03 over which the buffer layer 04 has been disposed. That is, in some embodiments, prior to fabricating the pixel circuit, the buffer layer 04 may be formed over the substrate 03 to reduce the influence of impurities, which may be present on the surface of the substrate 03, on the pixel circuit. In some embodiments, the OLED 02 may be disposed directly on the substrate 03. In some other embodiments, the OLED 02 may be disposed over the buffer layer 04 which is above the substrate 03.

The driving current $I_{OLED}$ outputted from the driving transistor to the light-emitting diode may satisfy the formula: $I_{OLED} = \gamma * (V_{gs} - V_{th})^2$, where $V_{gs}$ is a voltage difference between the gate electrode and the source electrode of the driving transistor, $V_{th}$ is a threshold voltage of the driving transistor, and $\gamma$ is a coefficient determined by characteristic dimensions and process parameters of the driving transistor. That is, the driving current outputted from the driving transistor may be related to the threshold voltage $V_{th}$ of the driving transistor, and the driving currents outputted from two driving transistors to OLEDs may be different if the threshold voltages of the two driving transistors are different. The uniformity of threshold voltage of multiple polysilicon transistors may be positively correlated with the uniformity of the grain size of the active medium (polysilicon) in the polysilicon transistors, i.e., a more uniform grain size in the active medium across the multiple polysilicon transistors may result in a more uniform threshold voltage across the multiple polysilicon transistors. Further, the magnitude of the grain size of the polycrystalline silicon may be negatively correlated with the uniformity of the grain size of the polycrystalline silicon. In addition, the magnitude of the grain size of the polycrystalline silicon may also be positively correlated with the magnitude of the on-state current of a transistor. The switching transistor may need to have a relatively large on-state current, and hence may need a relatively large grain size in the active medium.

In a pixel circuit of the conventional technologies, a grain size of an active medium in a switching transistor may be approximately equal to a grain size of an active medium in a driving transistor. The relatively large grain size of the active medium can allow the switching transistor to have a relatively large on-state current, but also may cause the grain size of the active medium in the driving transistor to be relatively non-uniform. Accordingly, the non-uniformity of the grain size of the active medium in the driving transistor may cause a relatively large non-uniformity in threshold voltage.

In some embodiments, if the grain size of the second active medium of the switching transistor is regarded as a standard size, the grain size of the first active medium of the driving transistor may be smaller than the standard size. In addition, when the grain size is smaller, the grain size may be more uniform. Accordingly, non-uniformity of the threshold voltage of the driving transistors caused by the non-uniformity of the grain size may be less significant. Further, the driving current provided by the driving transistor under a driving voltage may be related to the threshold voltage of the driving transistor. When the threshold voltages of two driving transistors are similar, the driving currents provided by the two driving transistors under the same driving voltages may be similar. Consequently, in the display panel, the driving currents provided by the driving transistors to OLEDs may tend to be the same.

In some embodiments, the grain size of the second active medium in the switching transistor consistent with the disclosure may be approximately equal to a grain size of an active medium in a switching transistor in the conventional technologies. In some other embodiments, the grain size of the second active medium in the switching transistor consistent with the disclosure may not be equal to the grain size of the active medium in the switching transistor in the conventional technologies. In embodiments of the present disclosure, the grain size of the second active medium in the switching transistor consistent with the disclosure is not restricted, and may be selected according to various application scenarios. Further, in embodiments of the present disclosure, the grain size of the second active medium in the switching transistor does not have to be equal to the grain size of the first active medium. Thus, a second active medium having a relatively large grain size may be selected as needed, thereby ensuring a relatively large on-state current in the switching transistor.

In an array substrate consistent with the disclosure, the first active medium in the driving transistor and the second active medium in the switching transistor may both be polysilicon, and the grain size of the first active medium may be smaller than the grain size of the second active medium. That is, when the grain size of the second active medium of the switching transistor is regarded as a standard size, the grain size of the first active medium of the driving transistor may be smaller than the standard size. Further, since the grain size in the driving transistors is smaller, non-uniformity of threshold voltages in the driving transistors caused by non-uniform grain sizes may be smaller. As a result, in the OLED display panel, driving currents provided by the driving transistors to OLEDs may tend to be the same. Accordingly, the brightness of the light emitted from different pixel regions may tend to be the same, and the display performance of the OLED display panel may be improved.

The present disclosure provides a driving transistor. In some embodiments, the driving transistor may be a driving transistor as shown in FIG. 1A. As shown in FIG. 1A, the driving transistor includes the first active medium A1 which can include polysilicon. In addition, the first active medium A1 may have a smaller grain size than the second active medium A2 in the switching transistor formed by polysilicon.

In some embodiments, as shown in FIG. 1A, the driving transistor further includes the first gate electrode B1, the first source/drain electrodes C1 (i.e., the first source electrode and the first drain electrode), and the first gate insulating block D1. The first gate insulating block D1 may have a greater thickness than the second gate insulating block D2 in the switching transistor.

In the driving transistor consistent with the disclosure, the first active medium of the driving transistor may include polysilicon, similar to the second active medium of the switching transistor. Further, the grain size of the first active medium may be smaller than the grain size of the second active medium. That is, if the grain size of the second active medium of the switching transistor is regarded as a standard size, the grain size of the first active medium of the driving transistor may be smaller than the standard size. Further, since the grain size is smaller, non-uniformity of the threshold voltages in driving transistors caused by non-uniform grain size may be smaller. As a result, in an OLED display panel including the driving transistors consistent with the disclosure, driving currents provided by the driving transistors to OLEDs may tend to be the same. Accordingly, the brightness of the light emitted from different pixel regions may tend to be the same, and the display performance of the OLED display panel may be improved.

Figure 1C:
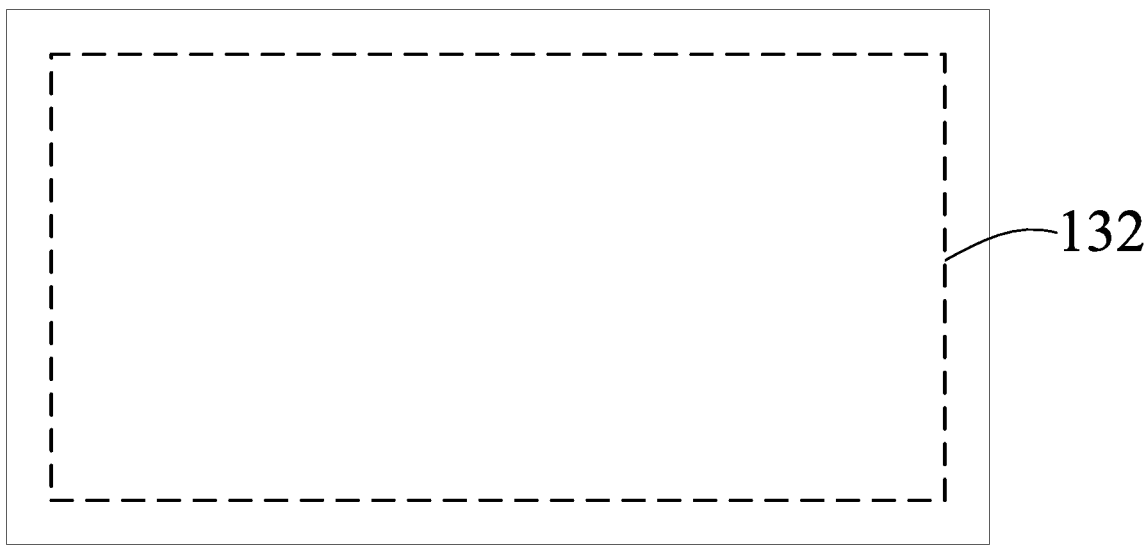
FIG. 1C illustrates a schematic view of an exemplary display panel according to various disclosed embodiments of the present disclosure.

The present disclosure provides a display panel. FIG. 1C illustrates a schematic view of an exemplary display panel 130 according to various disclosed embodiments of the present disclosure. As shown in FIG. 1C, the display panel 130 includes an array substrate 132. The array substrate 132 can be any array substrate consistent with the disclosure, such as the array substrate 100 shown in FIG. 1A. The display panel 130 may form a display device, alone or together with one or more other appropriate structures. The display device including the display panel may be an electronic paper, an OLED panel, a mobile phone, a tablet computer, a television, a monitor, a notebook computer, a digital photo frame, a navigator, or any suitable product or component having a display function. Any display panel including an array substrate consistent with the disclosure is within the scope of the present disclosure.

In the array substrate of the display panel consistent with the disclosure, the first active medium in the driving transistor and the second active medium in the switching transistor may both be polysilicon. Further, the first active medium may have a smaller grain size than the second active medium. That is, if the grain size of the second active medium of the switching transistor is regarded as a standard size, the grain size of the first active medium of the driving transistor may be smaller than the standard size. Further, since the grain size is smaller, non-uniformity of threshold voltages in the driving transistors caused by non-uniform grain size may be smaller. As a result, in the OLED display panel, driving currents provided by driving transistors to OLEDs may tend to be the same. Accordingly, the brightness of the light emitted from different pixel regions may tend to be the same, thereby improving the display performance of the OLED display panel.

Figure 2:
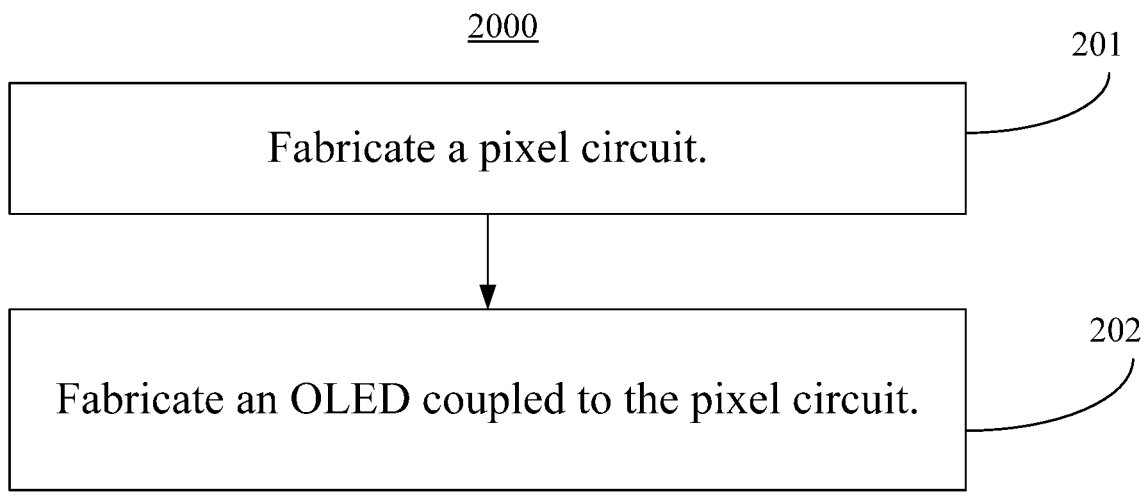
FIG. 2 illustrates a flow chart of an exemplary fabrication method for an exemplary array substrate according to various disclosed embodiments of the present disclosure.

FIG. 2 illustrates a flow chart of an exemplary fabrication method 2000 for an exemplary array substrate according to various disclosed embodiments of the present disclosure. The exemplary fabrication method 2000 for the exemplary array substrate will be described with reference to FIG. 2.

At 201, a pixel circuit is fabricated.

At 202, an OLED is fabricated. The OLED is coupled to the pixel circuit.

The pixel circuit may include a driving transistor and a switching transistor. The driving transistor may include a first active medium, and the switching transistor may include a second active medium. The first active medium and the second active medium may both be polysilicon. The first active medium may have a smaller grain size than the second active medium.

In an array substrate fabricated by the fabrication method for an array substrate consistent with the disclosure, the first active medium in the driving transistor and the second active medium in the switching transistor may both be polysilicon, and the first active medium may have a smaller grain size than the second active medium. That is, if the grain size of the second active medium of the switching transistor is regarded as a standard size, the grain size of the first active medium of the driving transistor may be smaller than the standard size. Further, since the grain size is smaller, non-uniformity of threshold voltages in the driving transistors caused by non-uniform grain sizes may be smaller. As a result, in the OLED display panel including the array substrate, driving currents provided by the driving transistors to OLEDs may tend to be the same. Accordingly, the brightness of the light emitted from different pixel regions may tend to be the same, and the display performance of the OLED display panel may be improved.

Figure 3:
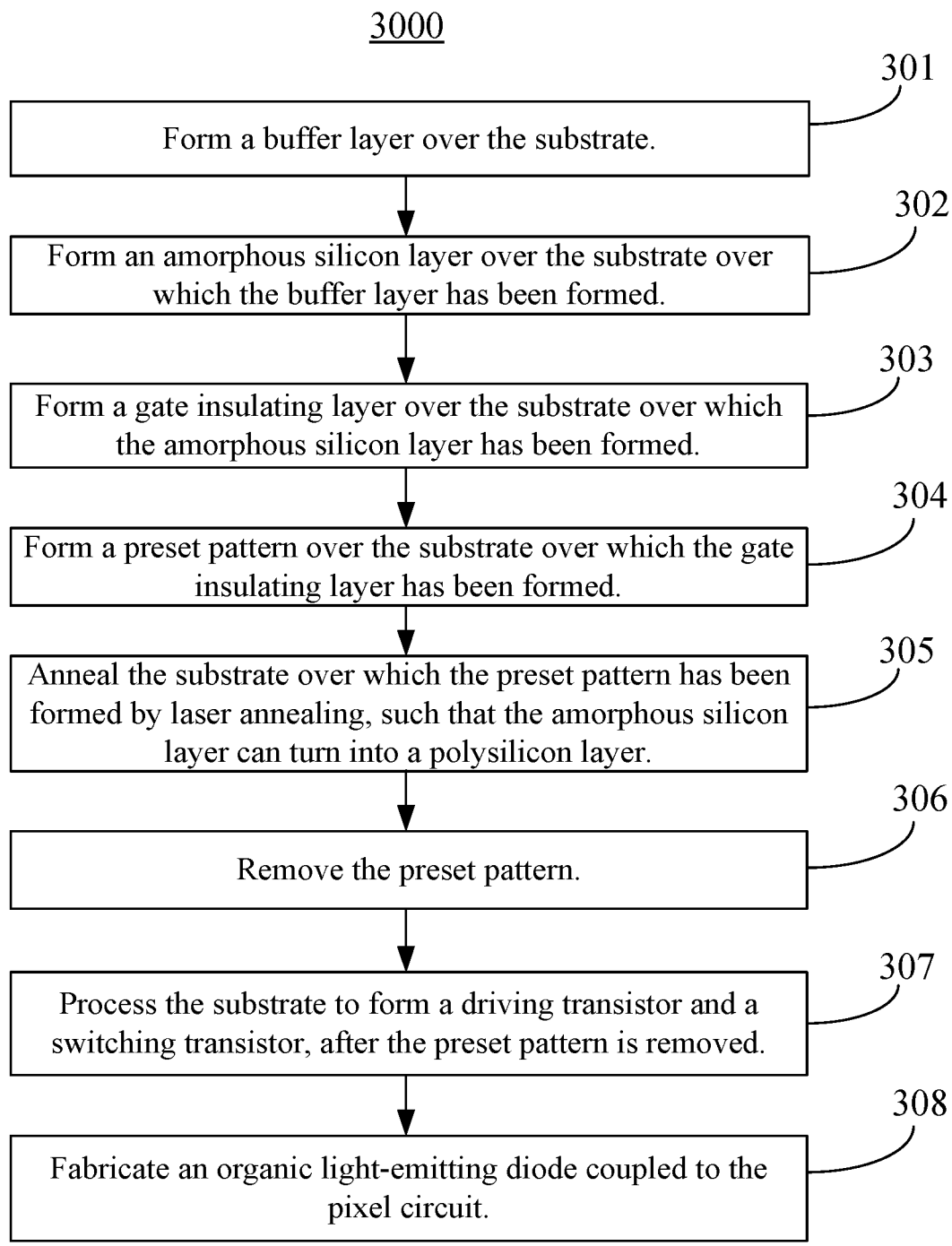
FIG. 3 illustrates a flow chart of another exemplary fabrication method for an exemplary array substrate according to various disclosed embodiments of the present disclosure.

FIG. 3 illustrates a flow chart of another exemplary fabrication method 3000 for an exemplary array substrate according to various disclosed embodiments of the present disclosure. With reference to FIG. 3, the exemplary fabrication method 3000 for the exemplary array substrate will be described in detail.

At 301, a buffer layer is formed over the substrate.

Figure 4:
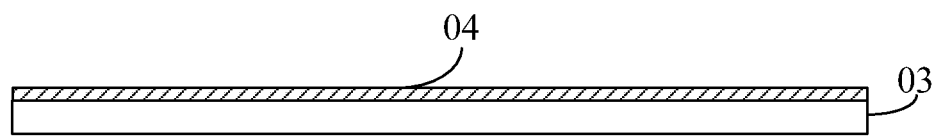
FIG. 4 illustrates a schematic view of an exemplary local structure of an exemplary array substrate according to various disclosed embodiments of the present disclosure.

In some embodiments, before the buffer layer is formed, the substrate can be cleaned to minimize impurities on the substrate as much as possible. After the cleaning, a buffer layer 04 as shown in FIG. 4 is formed over the substrate 03. The buffer layer 04 is cleaner, containing less impurities. Thus, when a pixel circuit is fabricated over the buffer layer 04, the impurities on the buffer layer may have less influence on the pixel circuit.

Referring again to FIG. 3, at 302, an amorphous silicon layer is formed over the substrate over which the buffer layer has been formed.

Figure 5:
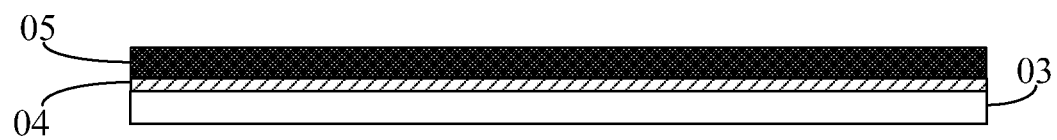
FIG. 5 illustrates a schematic view of another exemplary local structure of an exemplary array substrate according to various disclosed embodiments of the present disclosure.

As shown in FIG. 5, after the buffer layer 04 is formed over the substrate 03, the pixel circuit can be further fabricated over the buffer layer. For example, an amorphous silicon layer 05 is formed over the substrate 03 over which the buffer layer 04 has been formed. In some embodiments, the amorphous silicon layer 05 may have a thickness of approximately 500 angstroms.

In some embodiments, the amorphous silicon layer 05 may be deposited over the substrate 03 by coating, magnetron sputtering, thermal evaporation, plasma enhanced chemical vapor deposition (PECVD), or another appropriate method.

Referring again to FIG. 3, at 303, a gate insulating layer is formed over the substrate over which the amorphous silicon layer has been formed.

Figure 6:
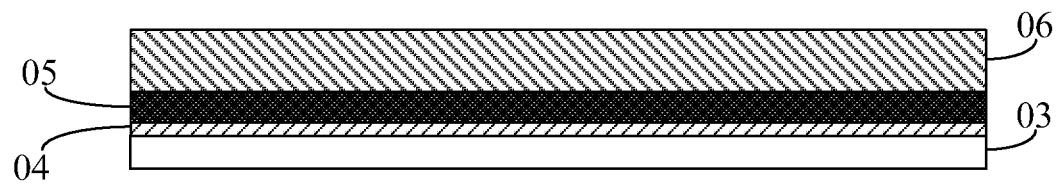
FIG. 6 illustrates a schematic view of another exemplary local structure of an exemplary array substrate according to various disclosed embodiments of the present disclosure.

As shown in FIG. 6, after the amorphous silicon layer 05 is formed over the substrate 03, a gate insulating layer 06 is formed over the substrate 03 over which the amorphous silicon layer 05 has been formed.

Referring again to FIG. 3, at 304, a preset pattern is formed over the substrate over which the gate insulating layer has been formed.

Figure 7:
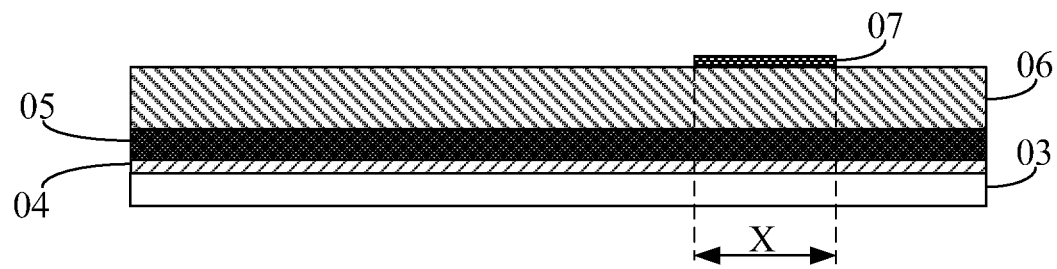
FIG. 7 illustrates a schematic view of another exemplary local structure of an exemplary array substrate according to various disclosed embodiments of the present disclosure.

As shown in FIG. 7, after the buffer layer 04, the amorphous silicon layer 05, and the gate insulating layer 06 are formed over the substrate 03, a preset pattern 07 is formed over the substrate 03 over which the gate insulating layer has been formed. In addition, an orthogonal projection region of the preset pattern 07 on the substrate 03 is a preset region X. Because the thickness of the preset pattern 07 is non-zero, the absorbance of the preset pattern 07 of a laser can be greater than zero.

In some embodiments, the material of the preset pattern 07 may include amorphous silicon, the preset pattern 07 can be an amorphous silicon pattern, and a thickness of the amorphous silicon pattern can range from approximately 100 angstroms to approximately 200 angstroms.

When forming the amorphous silicon pattern 07, first, an amorphous silicon material layer can be deposited over the substrate 03 by coating, magnetron sputtering, thermal evaporation, PECVD, or another appropriate method and, then, the amorphous silicon material layer can be processed by a patterning process to obtain the amorphous silicon pattern 07. The patterning process may include: photoresist coating, exposure, development, etching, and photoresist peeling. For example, the processing of the amorphous silicon material layer by the patterning process may include: coating a layer of photoresist over the amorphous silicon material layer; exposing the photoresist using a mask to form at least one fully exposed region and at least one non-exposed region; subsequently processing using a development process, such that the photoresist of the at least one fully exposed region is removed and the photoresist of the at least one non-exposed region is retained; etching away the portion of the amorphous silicon material layer corresponding to the at least one fully exposed region; and peeling off the photoresist of the at least one non-exposed region to obtain an amorphous silicon pattern after completing the etching.

Referring again to FIG. 3, at 305, the substrate over which the preset pattern has been formed is annealed by laser annealing, such that the amorphous silicon layer can turn into a polysilicon layer.

Figure 8:
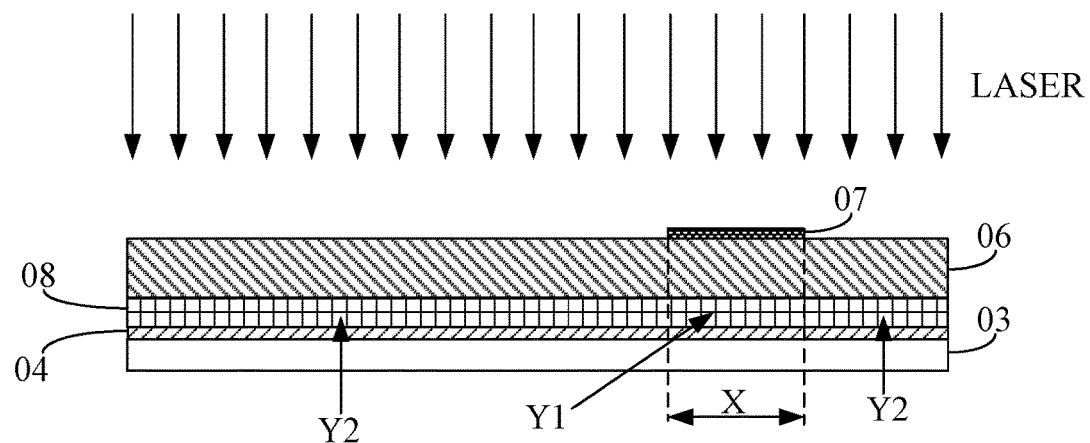
FIG. 8 illustrates a schematic view of exemplary laser annealing according to various disclosed embodiments of the present disclosure.

In some embodiments, as shown in FIG. 8, after the preset pattern 07 is formed, the substrate 03 over which the preset pattern 07 has been formed can be annealed by laser annealing, such that the amorphous silicon layer 05 formed at 302 can turn into a polysilicon layer 08 under the influence of laser. In some embodiments, the laser annealing can include excimer laser annealing (ELA).

As shown in FIG. 8, the polysilicon layer 08 includes a first region Y1 and a second region Y2. An orthogonal projection region of the first region Y1 on the substrate 03 may be the preset region X, and an orthogonal projection region of the second region Y2 on the substrate 03 may be located outside the preset area X. When performing laser annealing, the preset pattern 07 may cover the first region Y1. Thus, the preset pattern 07 may be capable of absorbing a portion of the laser that will irradiate the first region Y1. As a result, the first region Y1 may absorb less laser energy, while the second region Y2 may absorb more laser energy. An amorphous silicon region absorbing less laser energy may turn into a polysilicon region having a smaller grain size. Thus, after laser annealing at 305, the first region Y1 may have a smaller grain size than the second region Y2. In various application scenarios, the amount of laser energy absorbed by the first region Y1 may be changed by adjusting the thickness of the preset pattern and thereby changing the extent of laser absorption of the preset pattern. Accordingly, the grain size of the first region Y1 may be changed.

The first active medium in the driving transistor and the second active medium in the switching transistor which need to be formed later can both be located in the polysilicon layer. And an orthogonal projection of the first active medium on the substrate can be located in the preset region, and an orthogonal projection of the second active medium on the substrate can be located outside the preset region.

Referring again to FIG. 3, at 306, the preset pattern is removed.

Figure 9:
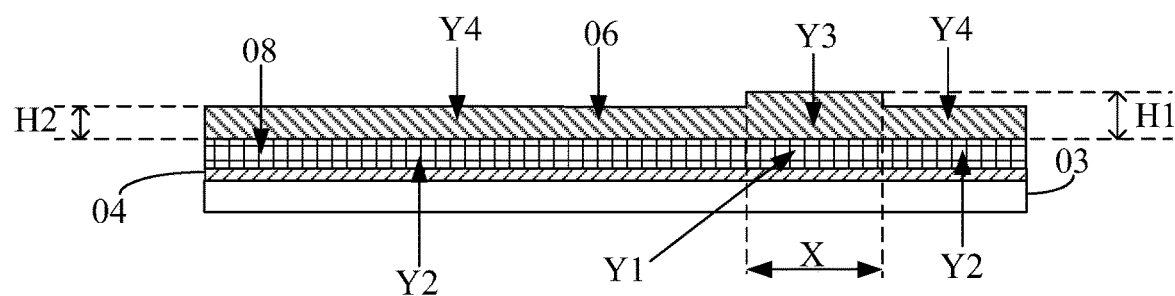
FIG. 9 illustrates a schematic view of another exemplary local structure of an exemplary array substrate according to various disclosed embodiments of the present disclosure.

As shown in FIG. 9, after the polysilicon layer 08 is formed, the preset pattern 07 can be removed.

In some embodiments, a preset etching solution that can etch both the preset pattern 07 and the gate insulating layer 06 can be used to remove the preset pattern 07. That is, the preset etching solution can react chemically with the preset pattern 07 and the gate insulating layer 06. When removing the preset pattern 07, the preset etching solution can be applied to the substrate 03 after laser annealing. As a result, the preset pattern 07 can be completely removed and, the region in the gate insulating layer 06 not covered by the preset pattern 07 in FIG. 7 can be thinned to obtain the structure shown in FIG. 9.

That is, after the preset pattern 07 is removed, as shown in FIG. 9, the gate insulating layer 06 includes a third region Y3 and a fourth region Y4. An orthogonal projection region of the third region Y3 on the substrate 03 may be the preset region X, and an orthogonal projection region of the fourth region Y4 on the substrate may be located outside the preset area X. The thickness H1 of the third region Y3 may be greater than the thickness H2 of the fourth region Y4.

Referring again to FIG. 3, at 307, after the preset pattern is removed, the substrate is processed to form a driving transistor and a switching transistor.

Figure 10:
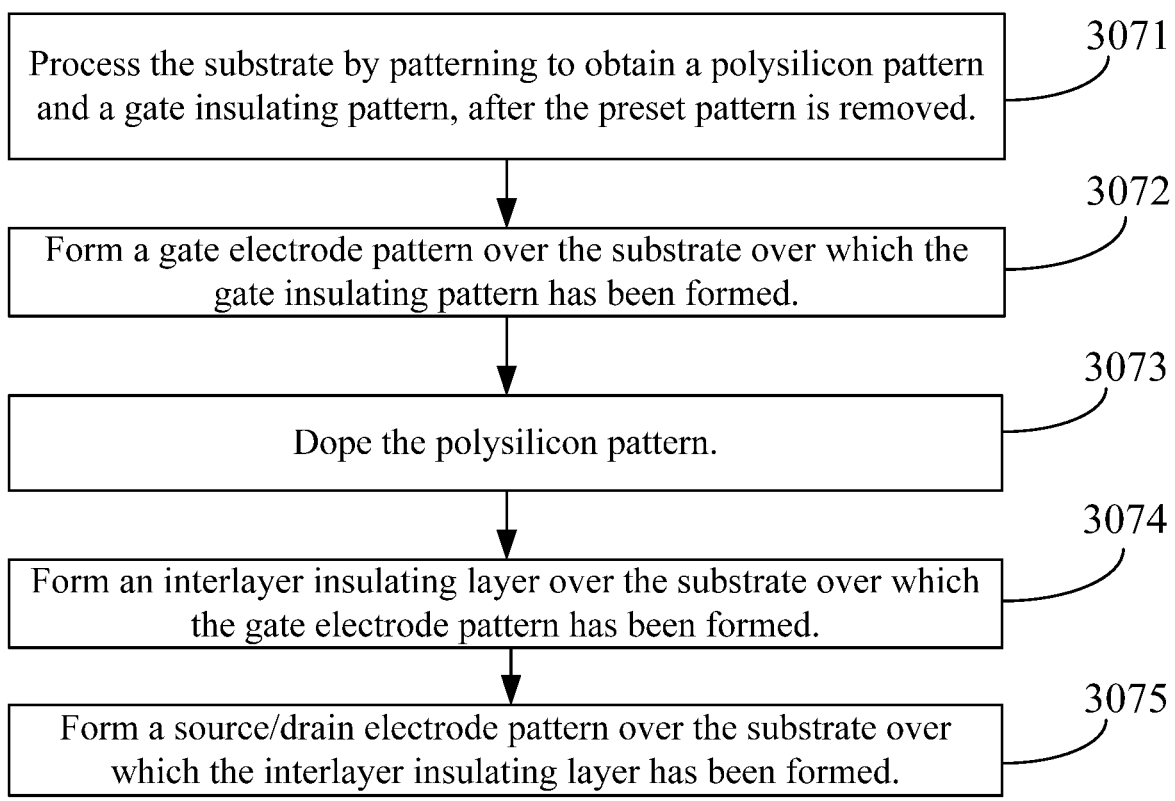
FIG. 10 illustrates a flow chart of an exemplary fabrication method for an exemplary driving transistor and an exemplary switching transistor according to various disclosed embodiments of the present disclosure.

The processing at 307 will be described in detail with reference to FIG. 10.

At 3071, after the preset pattern is removed, the substrate is processed by patterning to obtain a polysilicon pattern and a gate insulating pattern.

Figure 11:
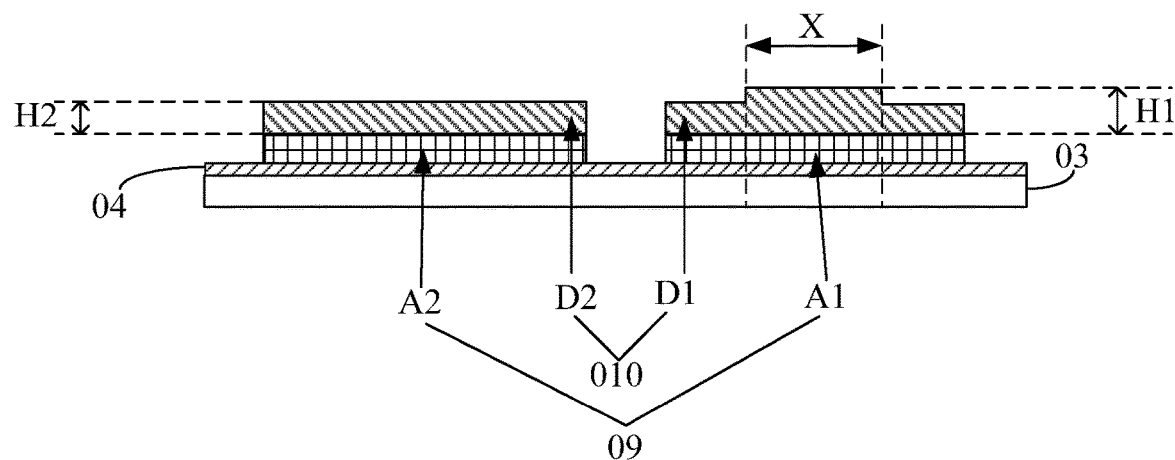
FIG. 11 illustrates a schematic view of another exemplary local structure of an exemplary array substrate according to various disclosed embodiments of the present disclosure.

Referring to FIGS. 9 and 11, at 3071, after the preset pattern 07 is removed, the substrate is processed by patterning, such that a portion of the polysilicon layer 08 is removed to form the polysilicon pattern 09, and a portion of the gate insulating layer 06 is removed to form a gate insulating pattern 010.

In some embodiments, as shown in FIG. 11, the polysilicon pattern 09 includes the first active medium A1 and the second active medium A2. The gate insulating pattern 010 includes the first gate insulating block D1 stacked over the first active medium A1, and the second gate insulating block D2 stacked over the second active medium A2.

Referring again to FIG. 10, at 3072, a gate electrode pattern is formed over the substrate over which the gate insulating pattern has been formed.

Figure 12:
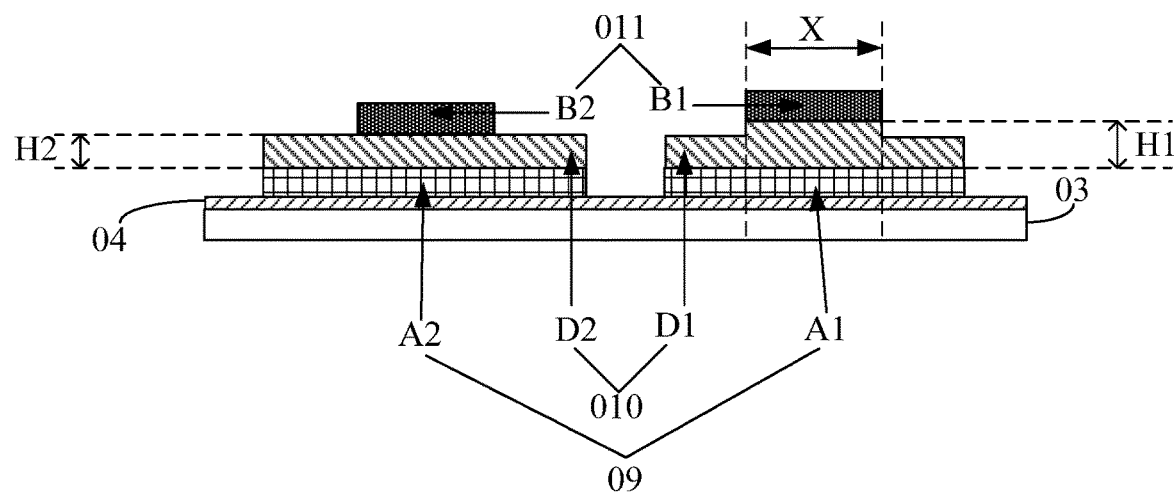
FIG. 12 illustrates a schematic view of another exemplary local structure of an exemplary array substrate according to various disclosed embodiments of the present disclosure.

As shown in FIG. 12, a gate electrode pattern 011 is formed over the substrate 03 over which the gate insulating pattern 010 has been formed. The gate electrode pattern 011 includes the first gate electrode B1 stacked over the first gate insulating block D1, and the second gate electrode B2 stacked over the second gate insulating block D2.

To form the gate electrode pattern 010, a gate electrode material layer may be deposited over the substrate 03 by coating, magnetron sputtering, thermal evaporation, PECVD, or another appropriate method and then the gate electrode material layer may be processed by a patterning process to obtain the gate electrode pattern 011. The patterning process may include: photoresist coating, exposure, development, etching, and photoresist peeling. For example, the processing of the gate electrode material layer using the patterning process may include: coating a layer of photoresist over the gate electrode material layer; exposing the photoresist using a mask to form at least one fully exposed region and at least one non-exposed region; subsequently processing using a development process, such that the photoresist of the at least one fully exposed region is removed, and the photoresist of the at least one non-exposed region is retained; etching the region of the gate electrode material layer corresponding to the at least one fully exposed region; and peeling off the photoresist of the at least one non-exposed region to obtain the gate electrode pattern 011 after completing the etching.

Referring again to FIG. 10, at 3073, the polysilicon pattern is doped.

Figure 13:
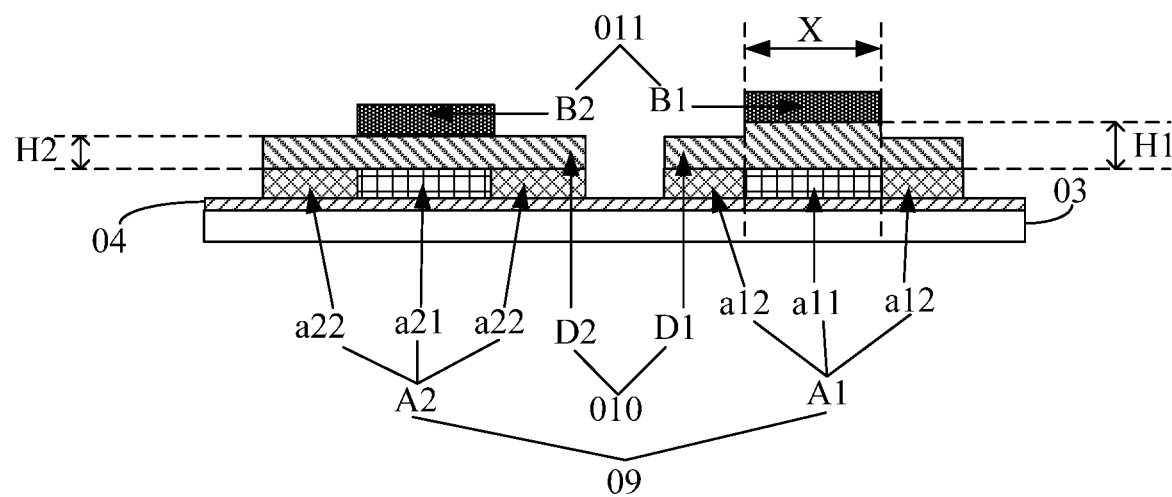
FIG. 13 illustrates a schematic view of another exemplary local structure of an exemplary array substrate according to various disclosed embodiments of the present disclosure.

As shown in FIG. 13, the first active medium A1 and the second active medium A2 in the polysilicon pattern 09 are doped. In some embodiments, an orthogonal projection region of an un-doped region a11 in the first active medium A1 on the substrate 03 can be overlapped with an orthogonal projection region of the first gate electrode B1 on the substrate 03; and doped regions a12 in the first active medium A1 may be regions other than the un-doped region a11. An orthogonal projection region of an un-doped region a21 in the second active medium A2 on the substrate 03 may be overlapped with an orthogonal projection region of the second gate electrode B2 on the substrate 03; and doped regions a22 in the second active medium A2 may be regions other than the un-doped region a21.

Referring again to FIG. 10, at 3074, an interlayer insulating layer is formed over the substrate over which the gate electrode pattern has been formed.

Figure 14:
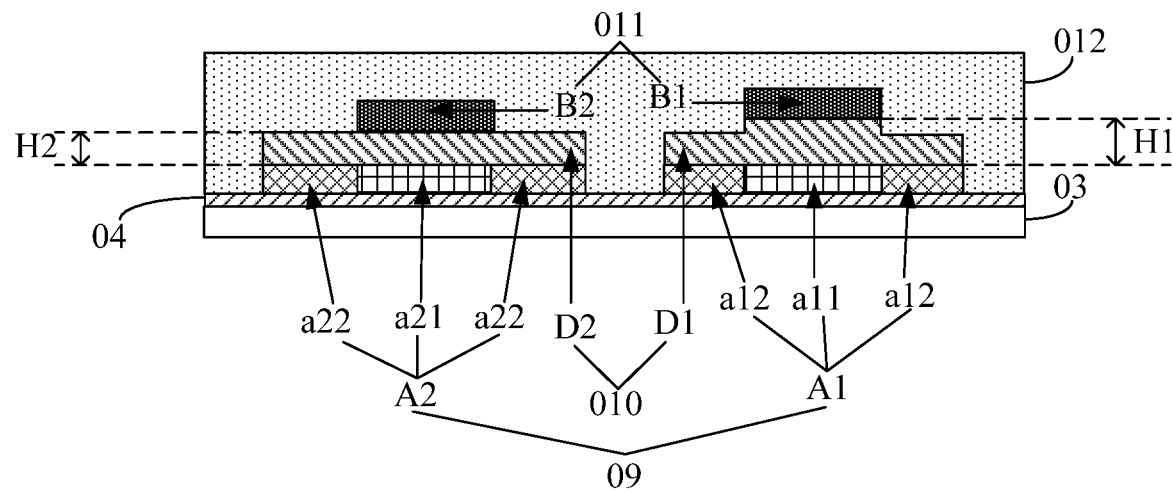
FIG. 14 illustrates a schematic view of another exemplary local structure of an exemplary array substrate according to various disclosed embodiments of the present disclosure.

As shown in FIG. 14, an interlayer insulating layer 012 is formed over the substrate 03 over which the gate electrode pattern 011 has been formed.

Referring again to FIG. 10, at 3075, a source/drain electrode pattern is formed over the substrate over which the interlayer insulating layer has been formed.

Figure 15:
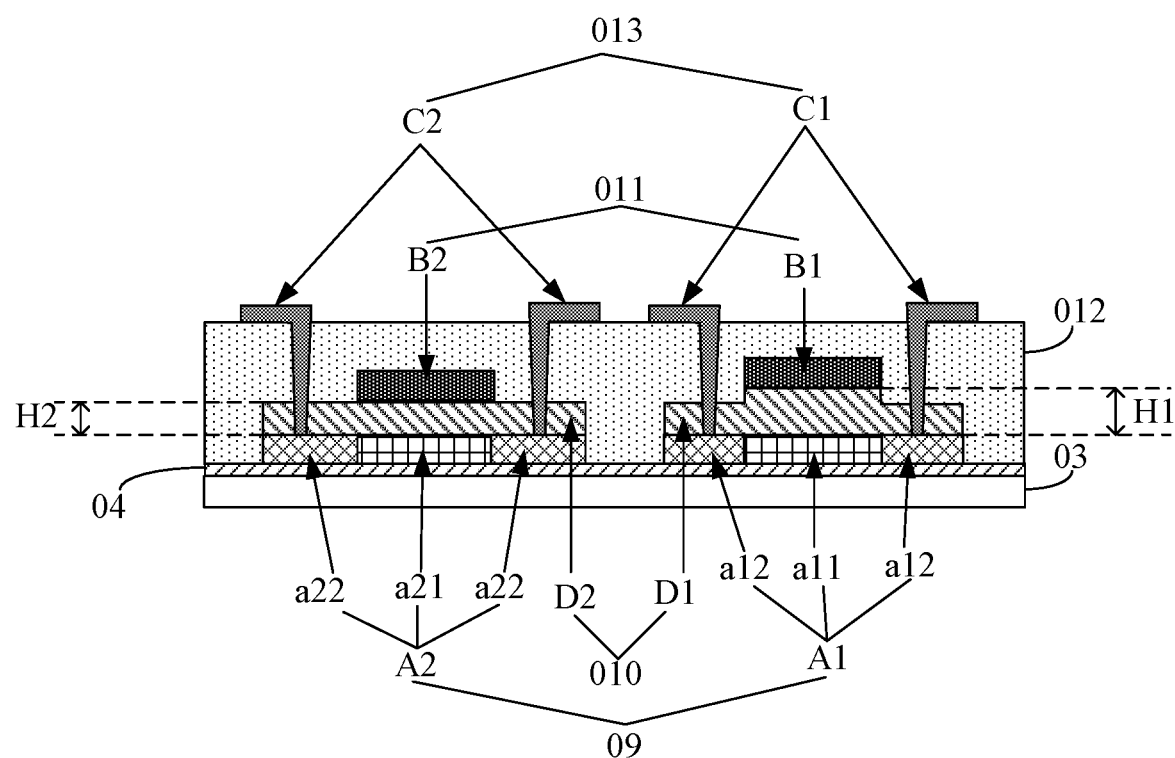
FIG. 15 illustrates a schematic view of another exemplary local structure of an exemplary array substrate according to various disclosed embodiments of the present disclosure.

As shown in FIG. 15, a source/drain electrode pattern 013 is formed over the substrate over which the interlayer insulating layer has been formed. The source/drain electrode pattern 013 includes first source/drain electrodes C1, i.e., a first source electrode and a first drain electrode, and second source/drain electrodes C2, i.e., a second source electrode and a second drain electrode. The first source/drain electrodes C1 are coupled to the first active medium A1 through via holes in the interlayer insulating layer 012, and the second source/drain electrodes C2 are coupled to the second active medium A2 through via holes in the interlayer insulating layer 012. In some embodiments, as shown in FIG. 15, the doped regions a12 in the first active medium A1 are coupled to the first source/drain electrodes C1, and the doped regions a22 in the second active medium A2 are coupled to the second source/drain electrode C2.

After the source/drain electrode pattern is formed, a driving transistor and a switching transistor of the pixel circuit are obtained. The driving transistor includes the first gate electrode B1, the first source/drain electrodes C1, and the first active medium A1. The switching transistor includes the second gate electrode B1, the second source/drain electrode C1, and the second active medium A2. The first active medium A1 and the second active medium A2 may both be polysilicon. The grain size of the first active medium A1 may be smaller than the grain size of the second active medium A2.

As discussed above, the driving current $I_{OLED}$ outputted from the driving transistor to the light-emitting diode may satisfy the formula: $I_{OLED} = \gamma * (V_{gs} - V_{th})^2$, where $V_{gs}$ is a voltage difference between the gate electrode and the source electrode of the driving transistor, $V_{th}$ is a threshold voltage of the driving transistor, and $\gamma$ is a coefficient determined by characteristic dimensions and process parameters of the driving transistor. That is, the driving current outputted from the driving transistor may be related to the threshold voltage $V_{th}$ of the driving transistor, and the driving currents outputted from two driving transistors to OLEDs may be different if the threshold voltages of the two driving transistors are different. The uniformity of threshold voltage of multiple polysilicon transistors may be positively correlated with the uniformity of the grain size of the active medium (polysilicon) in the polysilicon transistors, i.e., a more uniform grain size in the active medium across the multiple polysilicon transistors may result in a more uniform threshold voltage across the multiple polysilicon transistors. Further, the magnitude of the grain size of the polycrystalline silicon may be negatively correlated with the uniformity of the grain size of the polycrystalline silicon. In addition, the magnitude of the grain size of the polycrystalline silicon may also be positively correlated with the magnitude of the on-state current of a transistor. The switching transistor may need to have a relatively large on-state current, and hence may need a relatively large grain size in the active medium.

In a pixel circuit of the conventional technologies, a grain size of an active medium in a switching transistor may be approximately equal to a grain size of an active medium in a driving transistor. The relatively large grain size of the active medium can allow the switching transistor to have a relatively large on-state current, but also may cause the grain size of the active medium in the driving transistor to be relatively non-uniform. Accordingly, the non-uniformity of the grain size of the active medium in the driving transistor may cause a relatively large non-uniformity in threshold voltage.

In some embodiments, if the grain size of the second active medium of the switching transistor is regarded as a standard size, the grain size of the first active medium of the driving transistor may be smaller than the standard size. In addition, when the grain size is smaller, the grain size may be more uniform. Accordingly, non-uniformity of the threshold voltage of the driving transistors caused by the non-uniformity of the grain size may be less significant. Further, the driving current provided by the driving transistor under a driving voltage may be related to the threshold voltage of the driving transistor. When the threshold voltages of two driving transistors are similar, the driving currents provided by the two driving transistors under the same driving voltages may be similar. Consequently, in the display panel, the driving currents provided by the driving transistors to OLEDs may tend to be the same.

In some embodiments, the grain size of the second active medium in the switching transistor consistent with the disclosure may be approximately equal to a grain size of an active medium in a switching transistor in the conventional technologies. In some other embodiments, the grain size of the second active medium in the switching transistor consistent with the disclosure may not be equal to the grain size of the active medium in the switching transistor in the conventional technologies. In embodiments of the present disclosure, the grain size of the second active medium in the switching transistor consistent with the disclosure is not restricted, and may be selected according to various application scenarios. Further, in embodiments of the present disclosure, the grain size of the second active medium in the switching transistor does not have to be equal to the grain size of the first active medium. Thus, a second active medium having a relatively large grain size may be selected as needed, thereby ensuring a relatively large on-state current in the switching transistor.

The first gate insulating block may have a greater thickness than the second gate insulating block. A transistor having a thicker gate insulating block may have a larger subthreshold swing (SS) coefficient. In various application scenarios, in order to effectively control the gray scale, the driving transistor may need to have a greater SS coefficient than the switching transistor. Thus, in some embodiments, the thickness of the first gate insulating block of the driving transistor may be greater than the thickness of the second gate insulating block of the switching transistor. For example, the thickness of the gate insulating block below the first gate electrode may be greater than the thickness of the gate insulating block below the second gate electrode.

Referring again to FIG. 3, at 308, an organic light-emitting diode is fabricated, and the organic light-emitting diode is coupled to the pixel circuit.

In some embodiments, as shown in FIG. 1A, the flat layer 014 is formed over the substrate 03 over which the sour/drain electrode pattern 013 has been formed, and the OLED 02 is formed over the substrate 03 over which the flat layer 014 has been formed (one electrode of the OLED 02 is shown in FIG. 1A). The OLED 02 is coupled to the pixel circuit through the via hole in the flat layer 014.

In an array substrate fabricated by the fabrication method for an array substrate consistent with the disclosure, the first active medium in the driving transistor and the second active medium in the switching transistor may both be polysilicon, and the first active medium may have a smaller grain size than the second active medium. That is, if the grain size of the second active medium of the switching transistor is regarded as a standard size, the grain size of the first active medium of the driving transistor may be smaller than the standard size. Further, since the grain size is smaller, non-uniformity of threshold voltages in the driving transistors caused by non-uniform grain sizes may be smaller. As a result, in the OLED display panel including the array substrate, driving currents provided by the driving transistors to OLEDs may tend to be the same. Accordingly, the brightness of the light emitted from different pixel regions may tend to be the same, and the display performance of the OLED display panel may be improved.

The present disclosure provides an array substrate, a fabrication method thereof, a driving transistor, and a display panel. The array substrate may include pixel circuits and organic light-emitting diodes (OLED). A pixel circuit may include: a driving transistor having a first active medium, and a switching transistor having a second active medium. The first active medium and the second active medium may both be polysilicon. In addition, the first active medium may have a smaller grain size than the second active medium. The present disclosure is directed to improving display performance of the OLED display panel.

It should be noted that, the embodiments of the driving transistor, the pixel circuit, the display panel, and the fabrication method for the array substrate provided by the embodiments of the present disclosure can be referred to each other. In the present disclosure, the disclosed embodiments and the features of the disclosed embodiments can be combined under conditions without conflicts.

The Example numbers of the disclosed embodiments of the present disclosure are merely for the illustration and description purposes, and do not represent the merits of the disclosed embodiments.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure," "the present disclosure" or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:
1. An array substrate, comprising:
    a pixel circuit including:
        a driving transistor including a first active medium made of polysilicon, the first active medium having a first grain size; and a switching transistor including a second active medium made of polysilicon, the second active medium having a second grain size larger than the first grain size; and a light-emitting diode coupled to the pixel circuit;

wherein the first active medium and the second active medium are in a same layer;

the driving transistor further includes a first gate electrode, a first source electrode and a first drain electrode, and a first gate insulating block;

the switching transistor further includes a second gate electrode, a second source electrode and a second drain electrode, and a second gate insulating block; and an orthographic projection of a portion of polysilicon having the first grain size smaller than the second grain size on a base substrate covers an orthographic projection of a protrusion portion of the first gate insulating block on the base substrate, the portion of polysilicon having the first grain size being a portion in the first active medium that is undoped;

the orthographic projection of the protrusion portion of the first gate insulating block on the base substrate covers the orthographic projection of the portion of polysilicon having the first grain size smaller than the second grain size on a base substrate;

a thickness of the protrusion portion of the first gate insulating block is greater than a thickness of the second gate insulating block; and the protrusion portion of the first gate insulating block is a part of a unitary structure of the first gate insulating block.

2. The array substrate according to claim 1, further comprising:

a substrate; and a buffer layer over the substrate, wherein the pixel circuit is over the buffer layer.

3. The array substrate according to claim 2, wherein the first active medium and the second active medium are in direct contact with the buffer layer; and the first active medium and the second active medium are on a same side of the buffer layer away from the substrate.

4. The array substrate according to claim 3, wherein the first active medium is in direct contact with the first gate insulating block, and is between the first gate insulating block and the buffer layer; and the second active medium is in direct contact with the second gate insulating block, and is between the second gate insulating block and the buffer layer.

5. The array substrate according to claim 1, wherein the light-emitting diode includes an organic light-emitting diode.

6. A display panel, comprising the array substrate according to claim 1.

* * * * *